(12) United States Patent
Sato et al.

(10) Patent No.: US 7,994,894 B2
(45) Date of Patent: Aug. 9, 2011

(54) VARISTOR

(75) Inventors: Hiroyuki Sato, Tokyo (JP); Makoto Numata, Tokyo (JP); Yo Saito, Tokyo (JP); Hitoshi Tanaka, Tokyo (JP); Goro Takeuchi, Tokyo (JP); Osamu Taguchi, Tokyo (JP); Ryuichi Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 341 days.

(21) Appl. No.: 12/426,589

(22) Filed: Apr. 20, 2009

(65) Prior Publication Data
US 2010/0117782 A1 May 13, 2010

(30) Foreign Application Priority Data

May 13, 2008 (JP) ................................ P2008-126354

(51) Int. Cl.
*H01C 7/10* (2006.01)
(52) U.S. Cl. ........................................ 338/21; 338/22 R
(58) Field of Classification Search .................... 338/20, 338/21, 22 R, 25
See application file for complete search history.

(56) References Cited

U.S. PATENT DOCUMENTS

| 7,696,856 B2* | 4/2010 | Saito et al. ...................... 338/20 |
| 7,932,806 B2* | 4/2011 | Sato et al. ....................... 338/21 |
| 2007/0223170 A1* | 9/2007 | Sato et al. ..................... 361/118 |
| 2008/0068124 A1* | 3/2008 | Saito et al. ..................... 338/51 |
| 2010/0052841 A1* | 3/2010 | Sato et al. ....................... 338/20 |
| 2010/0117782 A1* | 5/2010 | Sato et al. ....................... 338/21 |

FOREIGN PATENT DOCUMENTS
JP A 8-246207 9/1996
* cited by examiner

*Primary Examiner* — James Harvey
(74) *Attorney, Agent, or Firm* — Oliff & Berridge, PLC

(57) ABSTRACT

A varistor having a favorable heat-dissipating property is provided.
In the varistor, a composite part having a favorable heat-dissipating property formed by a composite material composed of ZnO and Ag is arranged between main faces of a varistor matrix. Therefore, the heat transmitted from a semiconductor light-emitting device to a varistor part through an outer electrode can rapidly be transferred toward a main face on the opposite side through the composite part. In this varistor, side faces excluding inner side faces are exposed at side faces of the varistor matrix. Such a structure yields a favorable heat-dissipating property.

11 Claims, 17 Drawing Sheets

VARISTOR

BACKGROUND OF THE INVENTION

1. Field of the Invention

The present invention relates to a varistor.

2. Related Background of the Invention

A typical varistor comprises a varistor matrix exhibiting a voltage nonlinear characteristic and a pair of inner electrodes arranged within the varistor matrix while holding a part of the varistor matrix therebetween. A pair of outer electrodes corresponding to the inner electrodes are disposed on outer surfaces of the varistor matrix (see, for example, Japanese Patent Application Laid-Open No. 2002-246207).

SUMMARY OF THE INVENTION

A varistor is connected in parallel to an electronic device such as a semiconductor light-emitting device or an FET (Field Effect Transistor) and protects the electronic device against ESD (Electrostatic Discharge) surges. However, many of electronic devices generate heat during their operations. At high temperatures, the electronic devices themselves deteriorate their characteristics, thereby affecting their operations. Varistors connected to the electronic devices are required to have a favorable heat-dissipating property.

For overcoming the problem mentioned above, it is an object of the present invention to provide a varistor having a favorable heat-dissipating property.

For achieving the above-mentioned object, the varistor in accordance with the present invention comprises a ceramic matrix having first and second main faces opposing each other and a pair of outer electrodes disposed on the first main face; wherein the ceramic matrix comprises a varistor part, constituted by a semiconductor ceramic mainly composed of a metal oxide, exhibiting a varistor characteristic between the outer electrodes and a composite part, constituted by a composite material composed of a metal and a metal oxide, extending from the first main face to the second main face.

In this varistor, a composite part, formed by a composite material composed of a metal and a metal oxide, having a favorable heat-dissipating property is arranged so as to extend from the first main face to second main face of the ceramic matrix. Therefore, the heat transmitted from an external device to the varistor part through the outer electrodes can rapidly be transferred toward the second main face through the composite part.

Preferably, the composite part has first and second portions arranged such as to oppose each other at least partly, while the varistor part is positioned between the first and second portions. The composite part formed by a composite material composed of a metal and a metal oxide is superior to the varistor part in terms of flexibility. Therefore, positioning the varistor part between the first and second portions of the composite part makes it easier to disperse stresses of the varistor part when a surge current or other external forces act thereon.

Preferably, the varistor part is in contact with the first and second portions. This can transfer the heat of the varistor part to the composite part more rapidly.

Preferably, a surface of the composite part excluding opposing surfaces of the first and second portions forms an outer surface of the ceramic matrix. This can rapidly release the heat of the composite part to the outside, whereby the heat-dissipating property becomes more favorable.

Preferably, in the outer surface of the ceramic matrix, each side face orthogonal to the first and second main faces is covered with an electrically insulating material. This improves the electric insulation of the varistor.

Preferably, the varistor part has an inner electrode arranged such as to oppose the composite part at least partly. This can exhibit a varistor characteristic between the composite part and the inner electrode, whereby a desirable varistor characteristic can be obtained more reliably.

Preferably, the inner electrode has first and second inner electrodes arranged such as to oppose each other at least partly. This can exhibit a varistor characteristic between the first and second inner electrodes, whereby a desirable varistor characteristic can be obtained more reliably.

Preferably, the first inner electrode is arranged where the varistor part and the first portion are in contact with each other, while the second inner electrode is arranged where the varistor part and the second portion are in contact with each other. This can yield a desirable varistor characteristic more reliably while favorably keeping a heat-dissipating property.

Preferably, the second main face is further provided with a pair of outer electrodes. Such a structure is suitable for flip-chip surface mounting of the varistor.

Preferably, the metal oxide constituting the varistor part and the metal oxide constituting the composite part are made of the same material. This can inhibit cracks from entering between the varistor part and composite part during firing and the like.

Preferably, the metal oxide and metal are ZnO and Ag, respectively. Since Ag disperses into grain boundaries of ZnO which is the main ingredient of the varistor matrix, the joint strength between the varistor part and composite part can be enhanced.

As in the foregoing, the varistor in accordance with the present invention can yield a favorable heat-dissipating property.

DESCRIPTION OF THE PREFERRED EMBODIMENTS

In the following, preferred embodiments of the varistor in accordance with the present invention will be explained in detail with reference to the drawings.

First Embodiment

Figure 1:
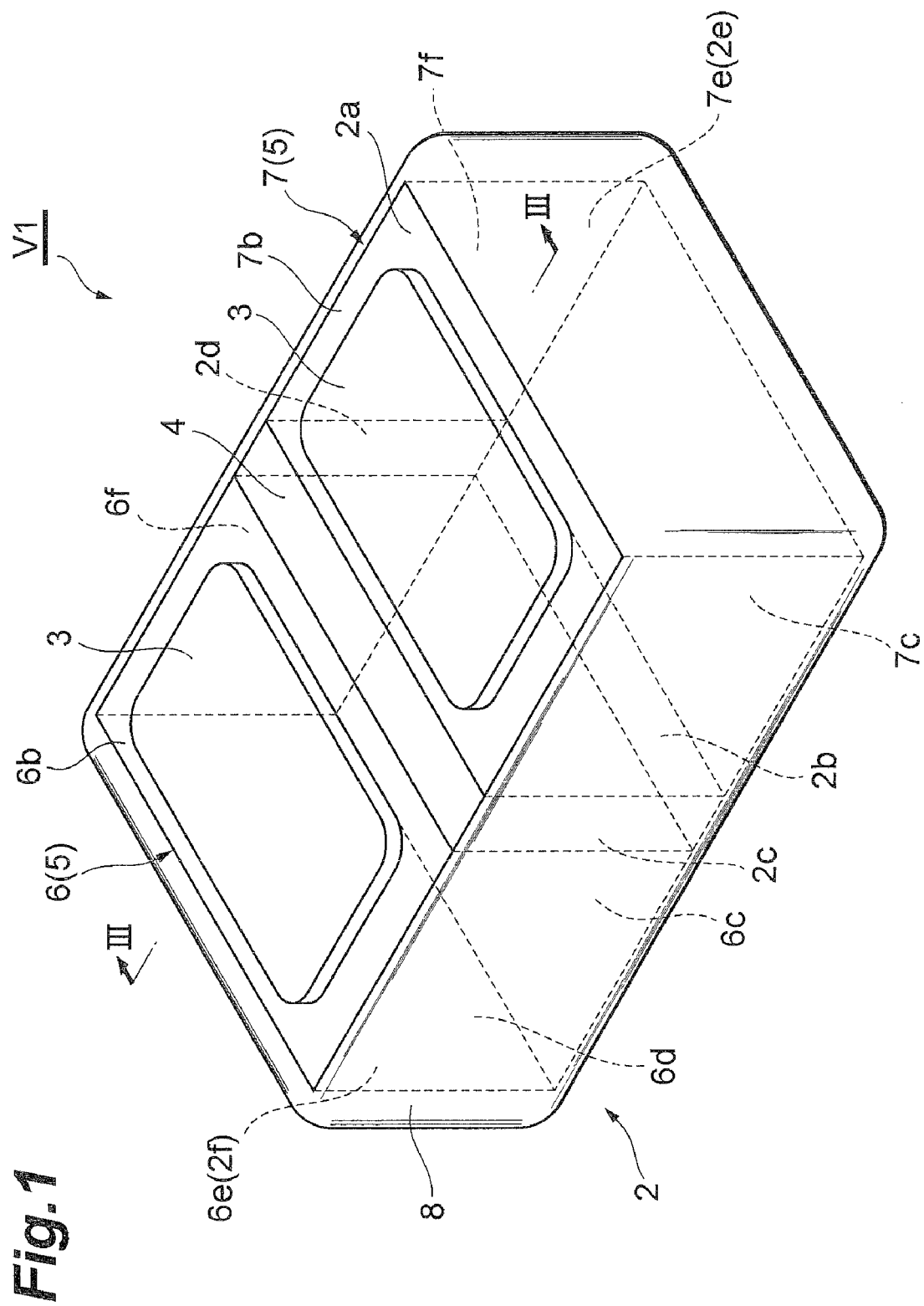
FIG. 1 is a perspective view illustrating the varistor in accordance with a first embodiment of the present invention.
Figure 2:
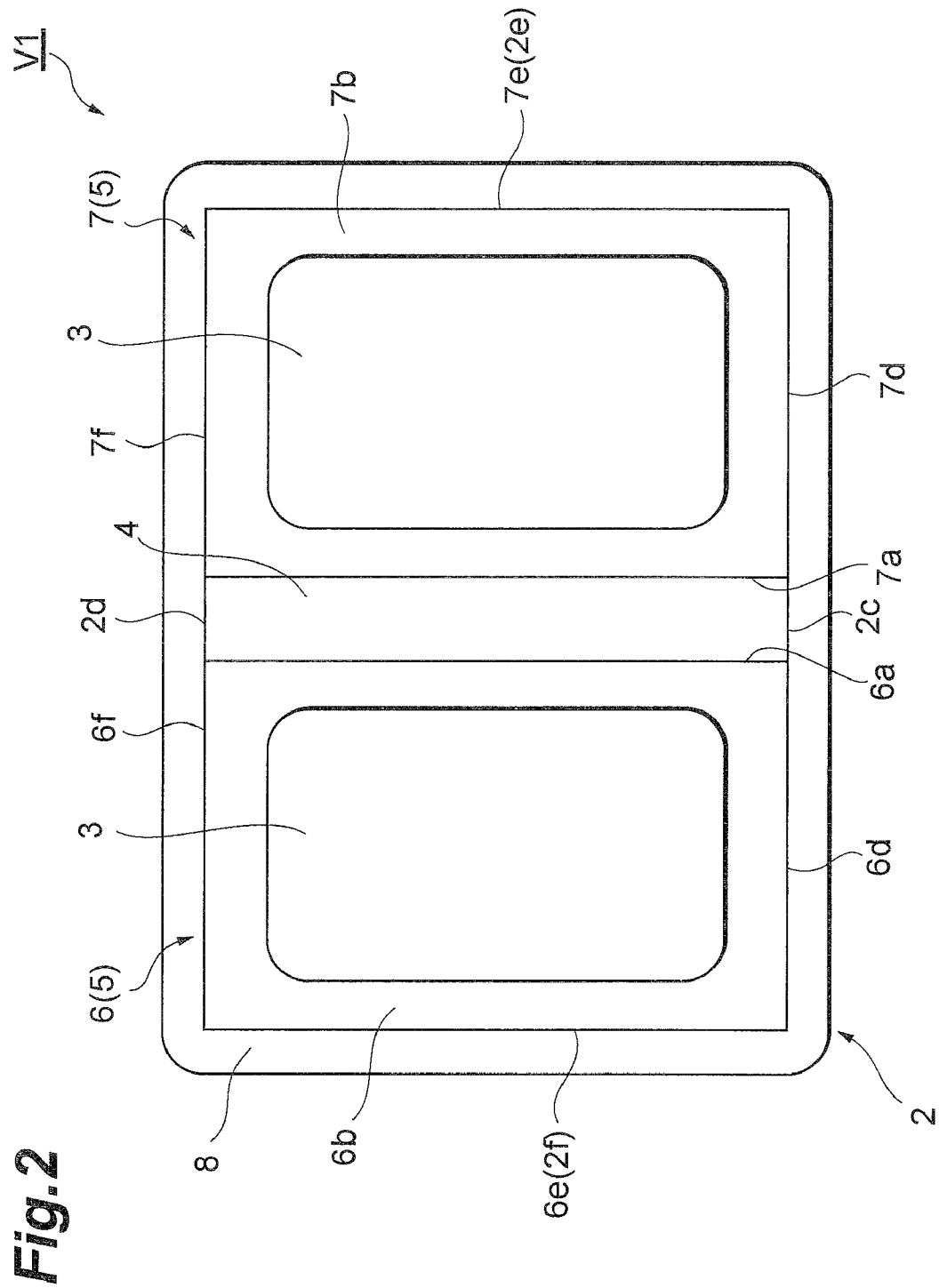
FIG. 2 is a plan view of the varistor illustrated in FIG. 1.
Figure 3:
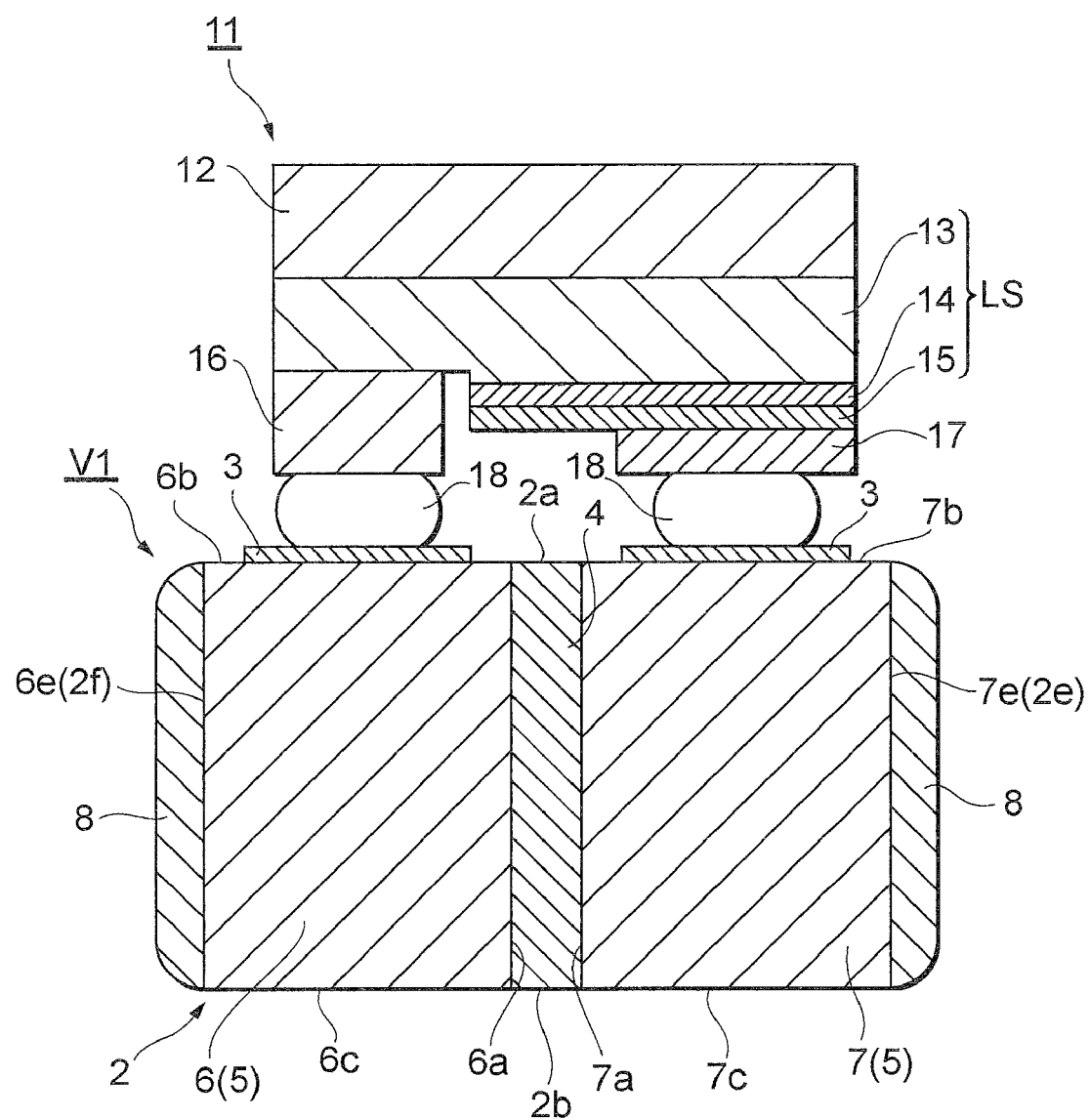
FIG. 3 is a sectional view taken along the line III-III of FIG. 1, illustrating a state mounted with a semiconductor light-emitting device.

FIG. 1 is a perspective view illustrating the varistor in accordance with the first embodiment of the present invention. FIG. 2 is a plan view of the varistor illustrated in FIG. 1, while FIG. 3 is a sectional view taken along the line III-III of FIG. 1 and illustrates a state mounted with a semiconductor light-emitting device. As illustrated in FIGS. 1 to 3, this varistor V1 comprises a varistor matrix (ceramic matrix) 2 and a pair of outer electrodes 3, 3.

The varistor matrix 2 is substantially formed like a rectangular parallelepiped and has main faces (first and second main faces) 2a, 2b opposing each other and four side faces 2c to 2f orthogonal to the main faces 2a, 2b. The varistor matrix 2 is constituted by a varistor part 4 and a composite part 5.

The varistor part 4 is a part which exhibits a voltage nonlinear characteristic between the outer electrodes 3, 3 and is formed by a semiconductor ceramic containing ZnO as a main ingredient and Pr or Bi as an accessory ingredient, for example. The varistor part 4 has a flat rectangular parallelepiped form and is positioned at a substantially center part of the varistor matrix 2. Side faces of the varistor part 4 are surfaces exposed at main faces 2a, 2b and side faces 2c, 2d of the varistor matrix 2, respectively.

The composite part 5 is formed by a composite material composed of ZnO and Ag, for example, and is constituted by a first portion 6 and a second portion 7 each having a substantially cubic form. The first and second portions 6, 7 are positioned so as to hold the varistor part 4 therebetween such that an inner side face 6a of the first portion 6 and an inner side face 7a of the second portion 7 oppose each other while being in contact with unexposed surfaces of the varistor part 4. Since the inner side face 6a of the first portion 6 and the inner side face 7a of the second portion 7 oppose each other while holding the varistor part 4 therebetween, the composite part 5 functions as inner electrodes of the varistor V1.

Five side faces 6b to 6g among the side faces of the first portion 6 excluding the inner side face 6a and five side faces 7b to 7g among the side faces of the second portion 7 excluding the inner side face 7a are surfaces exposed at outer surfaces of the varistor matrix 2.

More specifically, the side faces 6b, 6c of the first portion 6 and the side faces 7b, 7c of the second portion 7 are exposed at the main faces 2a, 2b of the varistor matrix 2. Therefore, the first and second portions 6, 7 of the composite part 5 extend from the main face 2a to main face 2b of the varistor matrix 2, so that the main faces 2a, 2b are connected to each other by the first and second portions 6, 7.

The side faces 6d, 6e, 6f of the first portion 6 and the side faces 7d, 7e, 7f of the second portion 7 are exposed at the side faces 2c to 2f of the varistor matrix 2, while the side faces 2c to 2f are covered with an insulating material 8. The insulating material 8 is a varistor material such as a glaze mainly composed of glass or a semiconductor ceramic, for example.

A pair of outer electrodes 3, 3 are formed substantially rectangular by firing a conductive paste mainly composed of Au or Ag, for example, and serve as connecting ends for a semiconductor light-emitting device 11 (see FIG. 3). The outer electrodes 3, 3 are in contact with the side faces 6b, 7b of the first and second portions 6, 7 exposed at the main face 2a of the varistor matrix 2, respectively.

The semiconductor light-emitting device 11 is a light-emitting diode (LED) made of a semiconductor based on GaN (gallium nitride) and comprises a sapphire substrate 12 and a layer structure LS formed on the sapphire substrate 12 as illustrated in FIG. 3. The layer structure LS includes an n-type semiconductor region 13, a light-emitting layer 14, and a p-type semiconductor region 15.

The n-type semiconductor region 13 is formed by epitaxially growing GaN on the sapphire substrate 12 and has n-type conductivity by being doped with an n-type dopant such as Si, for example. The n-type semiconductor region 13 has such a composition as to yield a lower refractive index and a greater bandgap as compared with the light-emitting layer 14 and serves as a lower cladding of the light-emitting layer 14.

The light-emitting layer 14, which is formed on the n-type semiconductor region 13, generates light in its light-emitting region when carriers supplied from the n-type semiconductor region 13 and p-type semiconductor region 15 are recombined. For example, the light-emitting layer 14 has a multiple-quantum-well (MQW) structure in which barrier layers and well layers are alternately laminated over a plurality of periods. The light-emitting region occurs in an area where carriers are injected into the light-emitting layer 14.

The p-type semiconductor region 15 is formed by epitaxially growing AlGaN on the light-emitting layer 14 and has p-type conductivity by being doped with a p-type dopant such as Mg, for example. The p-type semiconductor region 15 has such a composition as to yield a lower refractive index and a greater bandgap as compared with the light-emitting layer 14 as with the n-type semiconductor region 13 and serves as an upper cladding of the light-emitting layer 14.

A cathode electrode 16 and an anode electrode 17 are formed on the n-type semiconductor region 13 and p-type semiconductor region 15, respectively. The cathode electrode 16 and anode electrode 17 are formed with respective bump electrodes 18. The semiconductor light-emitting device 11 is bump-connected to the outer electrodes 3, 3 of the varistor V1, so as to be protected by the varistor V1 against ESD surges.

A process of manufacturing the above-mentioned varistor V1 will now be explained.

First, ZnO, which is a main ingredient of the varistor part 4, and Pr or Bi, which is an accessory ingredient, are mixed at a predetermined ratio, so as to prepare a varistor material. Subsequently, an organic binder, an organic solvent, an organic plasticizer, and the like are added to the varistor material, so as to yield a slurry. Similarly, ZnO and Ag, which are main ingredients of the composite part 5, are mixed at a predetermined ratio, so as to prepare a composite material. Then, an organic binder, an organic solvent, an organic plasticizer, and the like are added to the composite material, so as to yield a slurry.

Next, thus prepared slurries are applied onto films, so as to yield green sheets. Here, patterns corresponding to the varistor part 4 and composite part 5 are formed by printing the respective slurries on films, for example. Thereafter, the green sheets are stacked in a predetermined order, so as to form a sheet multilayer body. Thus formed sheet multilayer body is cut into chips, whereby green bodies are obtained.

Thereafter, heating is carried out at a temperature of 180° C. to 400° C. for about 0.5 to 24 hr, for example, so as to effect debindering. After the debindering, the green body is heated at a temperature of 800° C. or higher in an atmosphere of air or oxygen, so as to fire the varistor part 4 and composite part 5 together. This forms the varistor matrix 2.

Next, a conductive paste in which an organic binder and an organic solvent are mixed into a metal powder mainly composed of Au or Ag is prepared. This conductive paste is printed on the side faces 6b, 7b of the first and second portions 6, 7 of the composite part 5 exposed at the main face 2a of the varistor matrix 2. Heating it at a temperature of 800° C. or higher in an oxygen atmosphere forms the outer electrodes 3, 3. Thereafter, the insulating material 8 is formed such as to cover the side faces 2c to 2f of the varistor matrix 2, whereby the above-mentioned varistor V1 is completed.

In the varistor V1, the composite part 5, which is formed by a composite material composed of ZnO and Ag and has a favorable heat-dissipating property, is arranged such as to extend from the main face 2a to main face 2b of the varistor matrix 2 as explained in the foregoing. Therefore, the heat transmitted from the semiconductor light-emitting device 11 to the varistor part 4 through the outer electrodes 3, 3 can rapidly be transferred toward the main face 2b through the composite part 5.

In the varistor V1, the composite part 5 is divided into the first portion 6 and second portion 7, while the varistor part 4 is held between the first and second portions 6, 7. Holding the varistor part 4 with the composite part 5, which contains Ag and thus is superior to the varistor part 4 in terms of flexibility, makes it easier to disperse stresses of the varistor part 4 when a surge current or other external forces act thereon. This can inhibit cracks from being generated in the varistor part 4 and the like, thereby improving reliability. The inner side faces 6a, 7a of the first and second portions 6, 7 opposing each other are in contact with the unexposed surfaces of the varistor part 4. This further secures the heat-dissipating property.

In the varistor V1, the side faces 6b to 6f, 7b to 7f excluding the above-mentioned inner side faces 6a, 7a are exposed at their corresponding side faces 2c to 2f of the varistor matrix 2. The side faces 2c to 2f of the varistor matrix 2 are covered with the insulating material 8. Such a structure allows the varistor V1 to ensure the electric insulation while keeping the heat-dissipating property.

Both of the respective metal oxides constituting the varistor part 4 and composite part 5 use ZnO. Thus making the varistor part 4 and composite part 5 use the same material can inhibit cracks from entering between the varistor part 4 and composite part 5 at the time of firing.

Ag contained in the composite part 5 disperses into grain boundaries of ZnO, which is the main ingredient of the varistor part 4, in the vicinity of boundaries between the varistor part 4 and the inner side faces 6a, 7a. This achieves a high joint strength between the varistor part 4 and composite part 5, whereby cracks can more favorably be inhibited from occurring.

Figure 4:
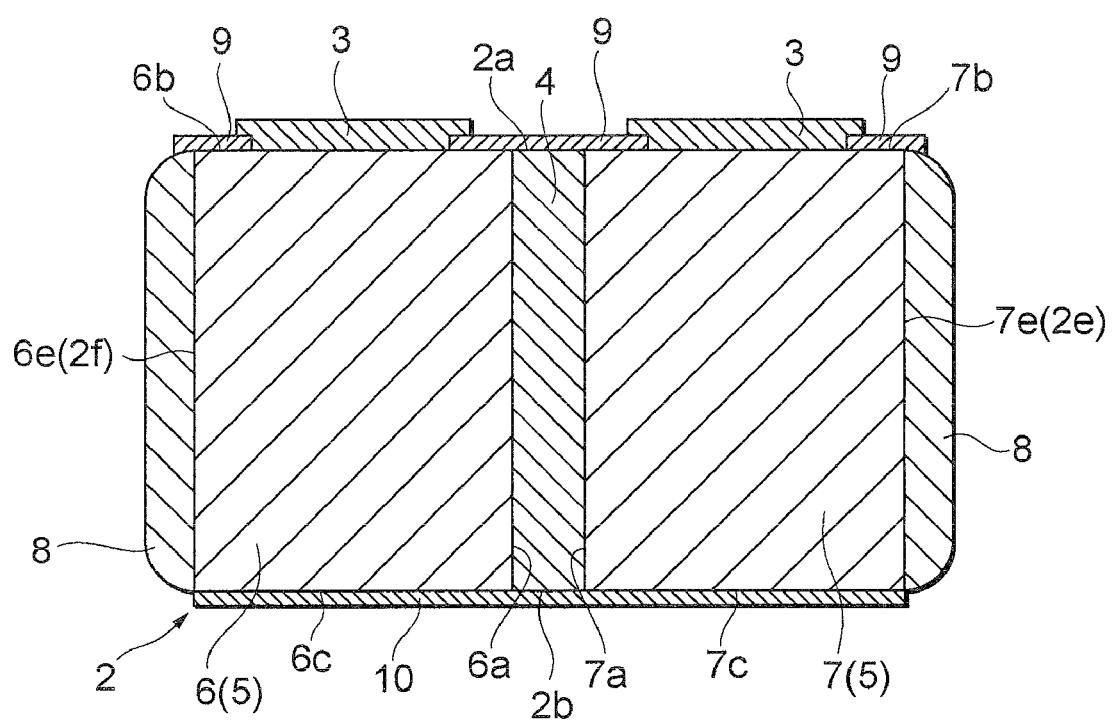
FIG. 4 is a sectional view illustrating the varistor in accordance with a modified example of the first embodiment.
Figure 5:
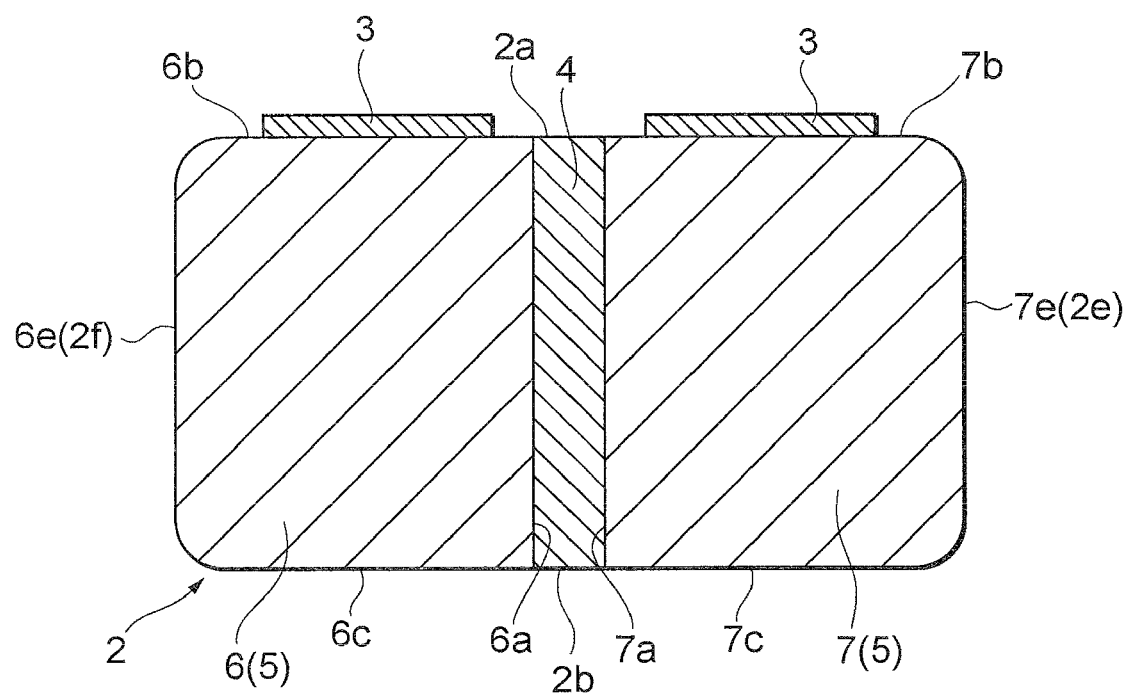
FIG. 5 is a sectional view illustrating the varistor in accordance with another modified example of the first embodiment.

As illustrated in FIG. 4, for example, insulating materials 9, 10 may be formed such as to cover the part free of the outer electrodes 3, 3 on the main face 2a of the varistor matrix 2 and the whole main face 2b of the varistor matrix 2, respectively, in addition to the insulating material 8 covering the side faces 2c to 2f of the varistor matrix 2. This further enhances the electric insulation of the varistor V1. As illustrated in FIG. 5, for example, all the surfaces of the varistor matrix 2 may be free of insulating materials. This allows the varistor V1 to attain the highest heat-dissipating property.

Second Embodiment

Figure 6:
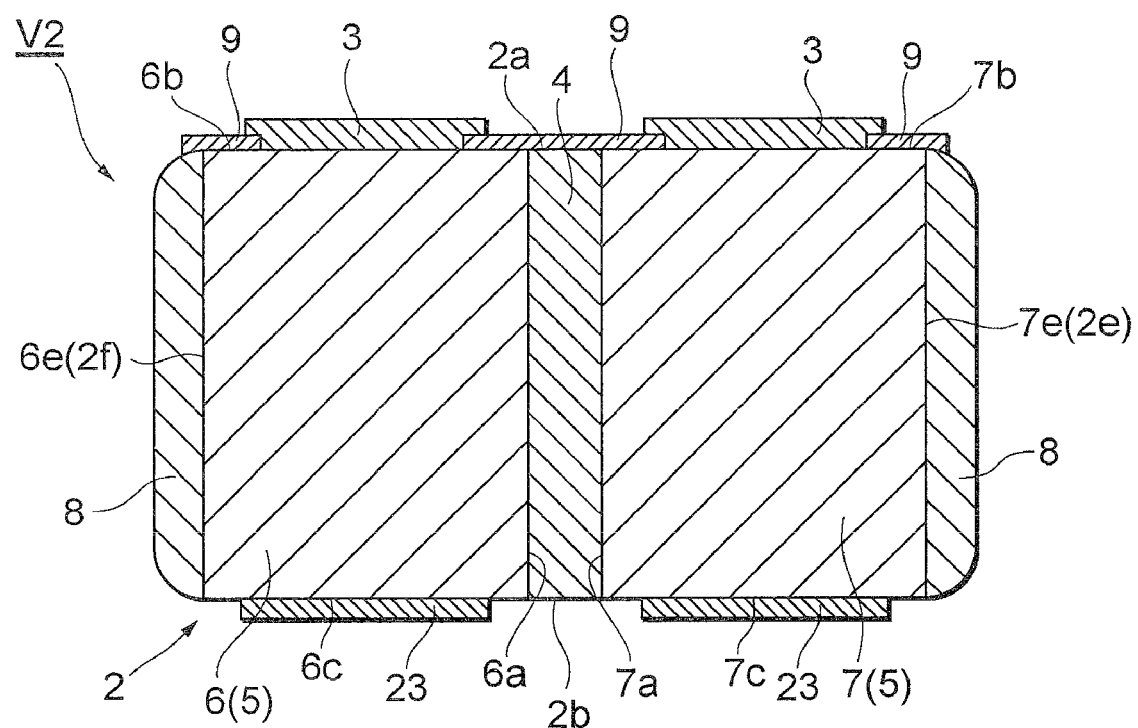
FIG. 6 is a sectional view illustrating the varistor in accordance with a second embodiment of the present invention.

FIG. 6 is a sectional view illustrating the varistor in accordance with the second embodiment of the present invention. As illustrated in this drawing, the varistor V2 in accordance with the second embodiment further comprises outer electrodes 23, 23 formed on the main face 2b, which makes it different from the first embodiment having no outer electrodes on the main face 2b of the varistor matrix 2.

That is, in the varistor V2, the outer electrodes 23, 23 are formed such as to come into contact with the side faces 6c, 7c of the first and second portions 6, 7 of the composite part 5 exposed at the main face 2b of the varistor matrix 2. The outer electrodes 23, 23 are arranged such as to oppose the outer electrodes 3, 3 on the main face 2a. On the main face 2a of the varistor matrix 2, the part free of the outer electrodes 3, 3 is formed with the insulating material 9.

Such a varistor V2 can also yield operations and effects similar to those of the varistor V1 in accordance with the first embodiment. Providing the outer electrodes 23, 23 with bump electrodes (not illustrated) allows flip-chip surface mounting of the varistor V2 onto a predetermined substrate.

Third Embodiment

Figure 7:
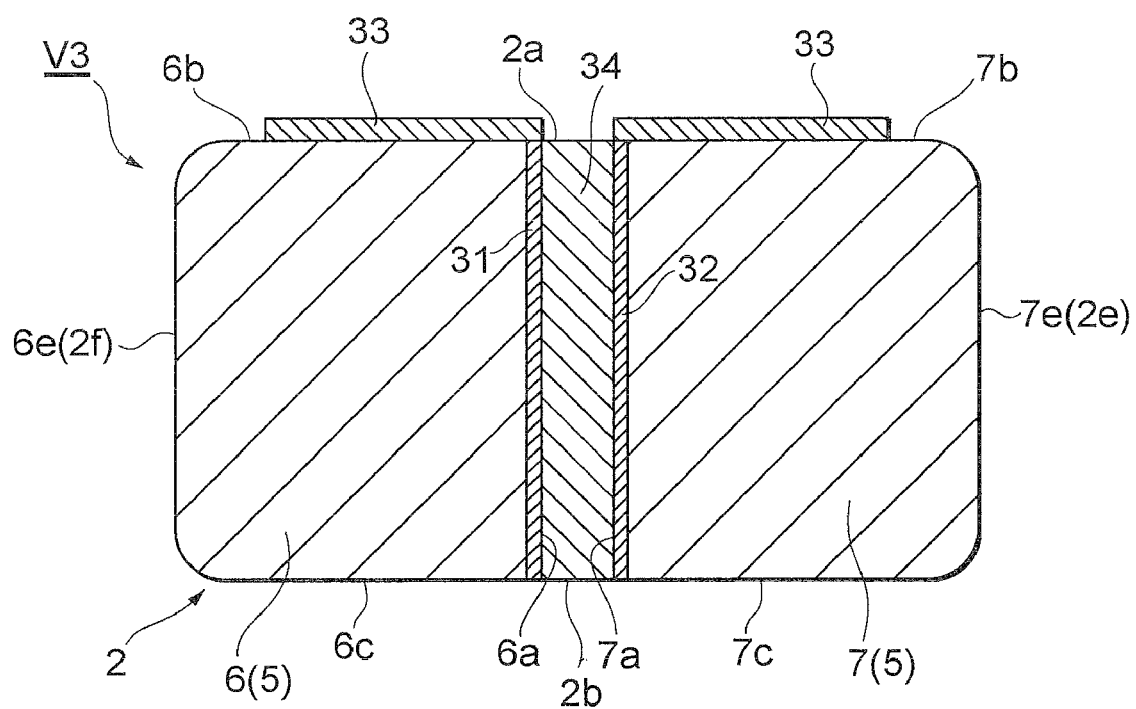
FIG. 7 is a sectional view illustrating the varistor in accordance with a third embodiment of the present invention.

FIG. 7 is a sectional view illustrating the varistor in accordance with the third embodiment of the present invention. As illustrated in this drawing, the varistor V3 in accordance with the third embodiment has a varistor part 34 formed with first and second inner electrodes 31, 32 opposing each other, which makes it different from the first embodiment free of the first and second inner electrodes 31, 32.

That is, the varistor part 34 of the varistor V3 has a first inner electrode 31 arranged along a part where the varistor part 34 and the first portion 6 of the composite part 5 are in contact with each other and a second inner electrode 32 arranged along a part where the varistor part 34 and the second portion 7 of the composite part 5 are in contact with each other.

The first and second inner electrodes 31, 32 are formed by a metal such as an Ag—Pd alloy, for example, and have a thermal conductivity which is several to several ten times that of ZnO which is a main ingredient of the varistor part 34. In the varistor V3, the outer electrodes 33, 33 extend to edges of the varistor part 34 on the main face 2a of the varistor matrix 2 and connect with the first and second inner electrodes 31, 32, respectively, at these edges of the varistor part 34.

Such a varistor V3 can yield operations and effects similar to those of the varistor V1 in accordance with the first embodiment. Since a varistor characteristic can be exhibited between the first and second inner electrodes 31, 32, a desirable varistor characteristic can be obtained more reliably. Since the first and second inner electrodes 31, 32 having a favorable thermal conductivity are in contact with the first and second parts 6, 7 of the composite part 5, a heat-dissipating property can be secured sufficiently.

Fourth Embodiment

Figure 8:
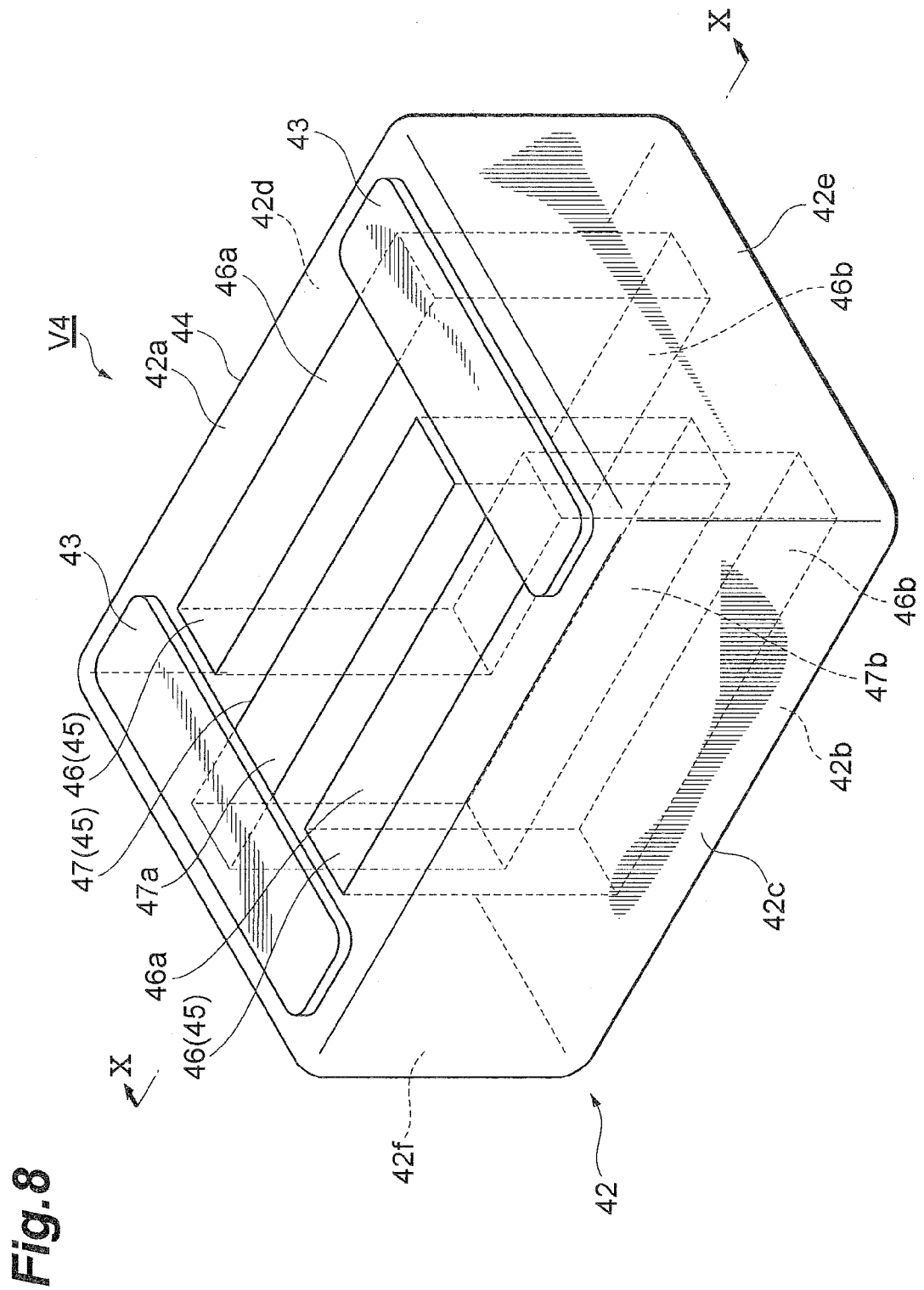
FIG. 8 is a perspective view illustrating the varistor in accordance with a fourth embodiment of the present invention.
Figure 9:
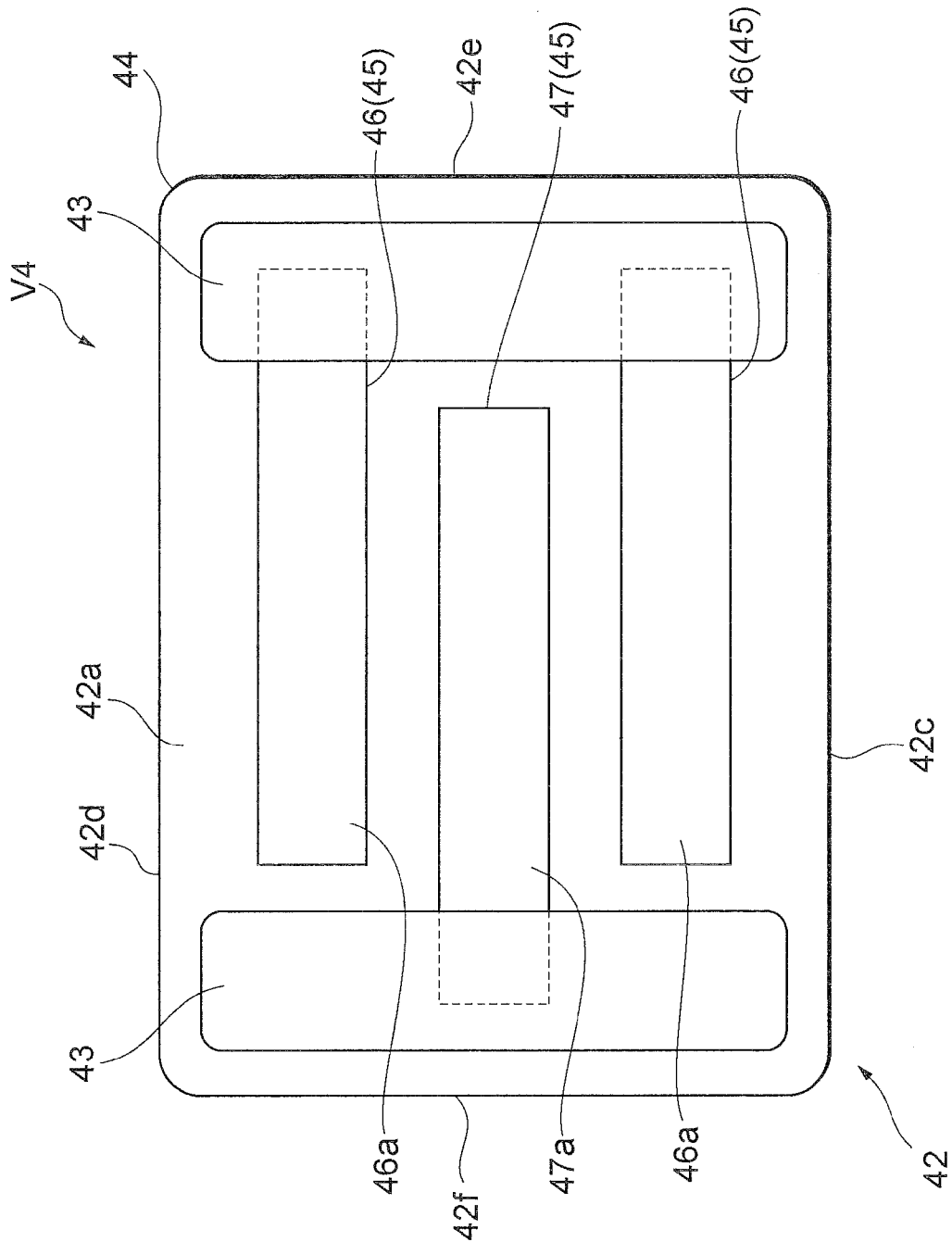
FIG. 9 is a plan view of the varistor illustrated in FIG. 8.
Figure 10:
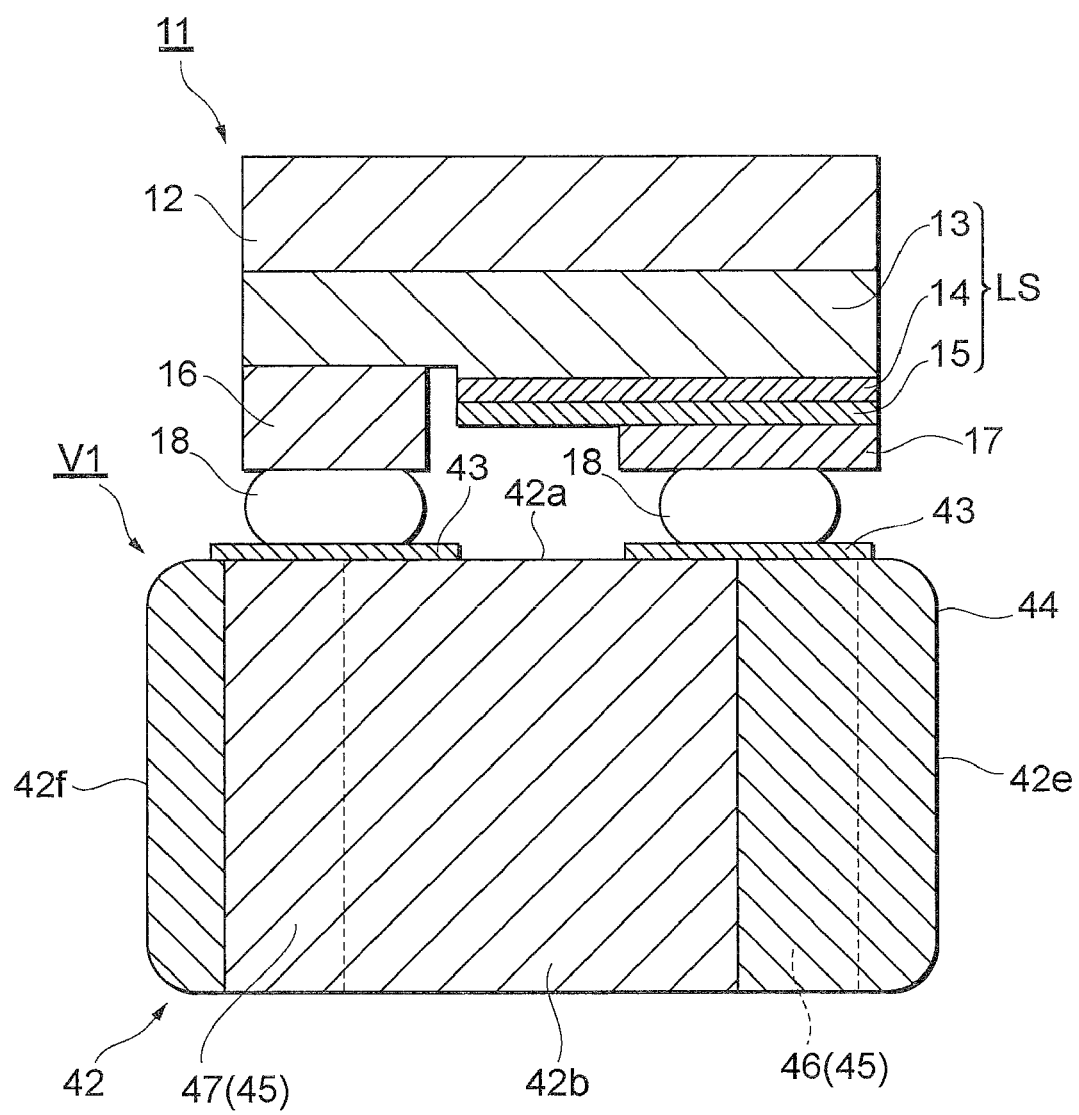
FIG. 10 is a sectional view taken along the line X-X of FIG. 8, illustrating a state mounted with a semiconductor light-emitting device.

FIG. 8 is a perspective view illustrating the varistor in accordance with the fourth embodiment of the present invention. FIG. 9 is a plan view of the varistor illustrated in FIG. 8, while FIG. 10 is a sectional view taken along the line X-X of FIG. 8 and illustrates a state mounted with a semiconductor light-emitting device. As illustrated in FIGS. 8 to 10, the varistor V4 comprises a varistor matrix 42 and a pair of outer electrodes 43, 43.

The varistor matrix 42 is provided with a varistor part 44 substantially formed like a rectangular parallelepiped and has main faces (first and second main faces) 42a, 42b opposing each other and four side faces 42c to 42f orthogonal to the main faces 42a, 42b. The varistor part 44 is a part which exhibits a voltage nonlinear characteristic between the outer electrodes 43, 43 and is formed by a semiconductor ceramic containing ZnO as a main ingredient and Pr or Bi as an accessory ingredient, for example.

A composite part 45 is provided within the varistor matrix 42. The composite part 45, which is formed by a composite material composed of ZnO and Ag, for example, is constituted by first portions 46, 46 and a second portion 47. Each of the first portions 46, 46 and second portion 47 is substantially shaped like a rectangular plate and is arranged substantially parallel to side faces 42c, 42d of the varistor matrix 42.

The first portions 46, 46 are arranged closer to the side face 42e of the varistor matrix 42 and oppose each other while holding a part of the varistor matrix 42 therebetween. Between the first portions 46, 46, the second portion 47 is arranged closer to the side face 42f of the varistor matrix 42. Hence, the first portions 46, 46 are in a staggered arrangement with the second portion 47, so that the first portions 46, 46 and the second portion 47 mostly oppose each other excluding the end parts on the side face 42e side of the first portions 46 and the end part on the side face 42f side of the second portion 47 when seen from the main face 42a side of the varistor matrix 42.

Such a structure allows the composite part 45 to function as inner electrodes of the varistor V4. Each of the first portions 46, 46 and second portion 47 has a thickness which is set greater than the gap between each of the first portions 46, 46 and the second portion 47.

The first portions 46, 46 and second portion 47 extend from the main face 42a to main face 42b of the varistor matrix 42. As a consequence, end faces 46a, 46b of each first portion 46 and end faces 47a, 47b of the second portion 47 are exposed at their corresponding main faces 42a, 42b of the varistor matrix 42.

Each of the pair of outer electrodes 43, 43 is formed substantially rectangular by firing a conductive paste mainly composed of Au or Ag, for example, and serves as a connecting end with the semiconductor light-emitting device 11 (see FIG. 10). The outer electrodes 43, 43 are formed along the edge parts closer to the side faces 42e, 42f, respectively, on the main face 42a of the varistor matrix 42.

One outer electrode 43 is in contact with the end faces 46a of the first portions 46 of the composite part 45 exposed at the main face 42a, while the other outer electrode 43 is in contact with the end face 47a of the second portion 47 of the composite part 45 exposed at the main face 42a. The semiconductor light-emitting device 11 is constructed as in the first embodiment and thus will not be explained in detail.

The composite part 45, which is formed by a composite material composed of ZnO and Ag and has a favorable heat-dissipating property, is arranged such as to extend from the main face 42a to main face 42b of the varistor matrix 42 in such a varistor V4 as well. Therefore, the heat transmitted from the semiconductor light-emitting device 11 to the varistor part 44 through the outer electrodes 43, 43 can rapidly be transferred toward the main face 42b through the composite part 45.

Each of the first portions 46, 46 and second portion 47 of the composite part 45 has a thickness which is set greater than the gap between each of the first portions 46, 46 and the second portion 47. This further enhances the heat-dissipating property of the varistor V4.

In the varistor V4, the first portions 46, 46 and second portion 47 also function as inner electrodes, whereby a desirable varistor characteristic can be obtained reliably. Both of the respective metal oxides constituting the varistor part 44 and composite part 45 use ZnO. Thus making the varistor part 44 and composite part 45 use the same material can inhibit cracks from entering between the varistor part 44 and composite part 45 at the time of firing.

Ag contained in the composite part 45 disperses into grain boundaries of ZnO, which is the main ingredient of the varistor part 44, in the vicinity of boundaries with the varistor part 44. This achieves a high joint strength between the varistor part 44 and composite part 45, whereby cracks can more favorably be inhibited from occurring.

Figure 11:
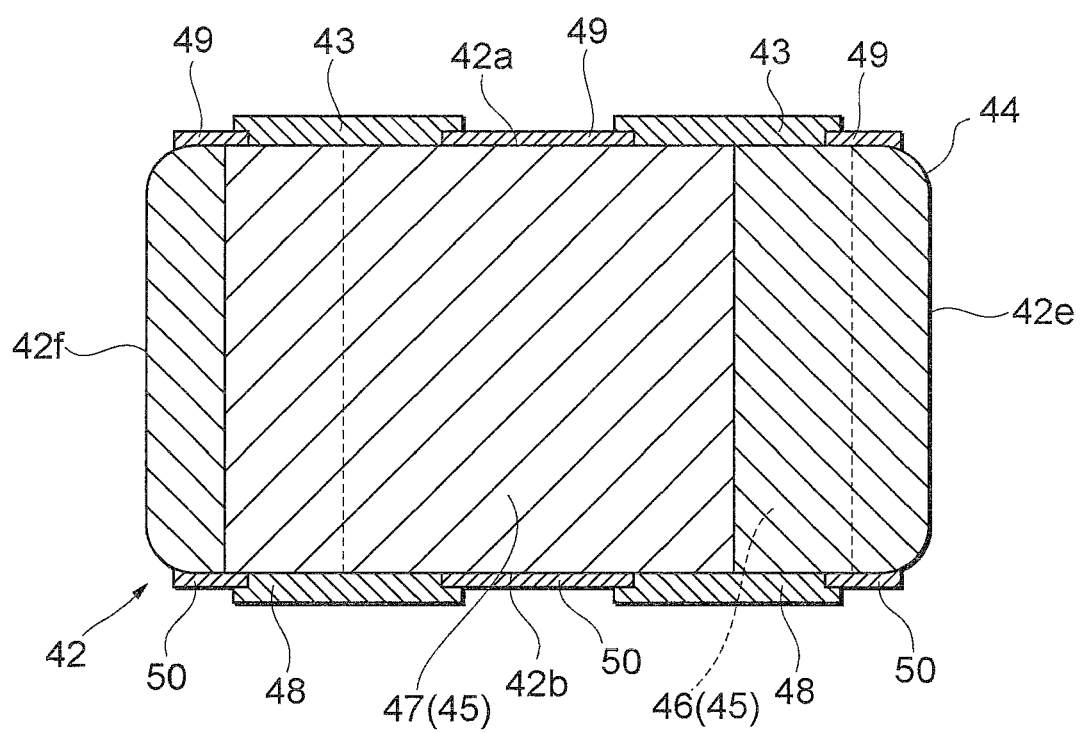
FIG. 11 is a sectional view illustrating the varistor in accordance with a modified example of the fourth embodiment.

As illustrated in FIG. 11, outer electrodes 48, 48 may further be formed on the main face 42b of the varistor matrix 42 in the varistor V4. In this case, as illustrated in the same drawing, the part free of the outer electrodes 43, 43 on the main face 42a of the varistor matrix 42 and the part free of the outer electrodes 48, 48 on the main face 42b of the varistor matrix 42 may be covered with insulating materials 49, 50, respectively.

Figure 12:
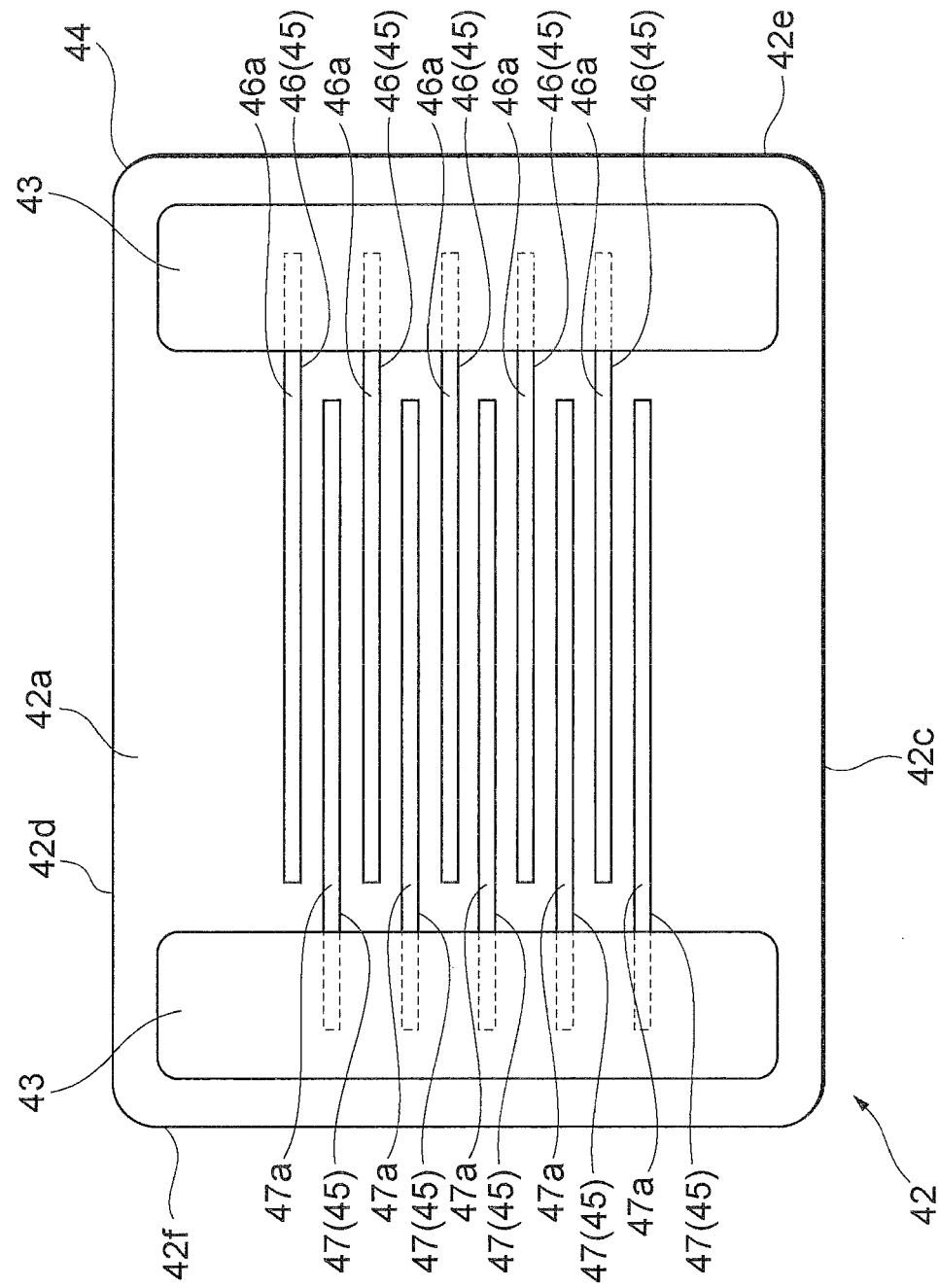
FIG. 12 is a plan view illustrating the varistor in accordance with another modified example of the fourth embodiment.

As illustrated in FIG. 12, the number of first portions 46 and second portions 47 arranged in the composite part 45 may be changed as appropriate according to varistor characteristics required. In the example illustrated in the same drawing, the first and second portions 46, 47 are increased to five pairs.

Fifth Embodiment

Figure 13:
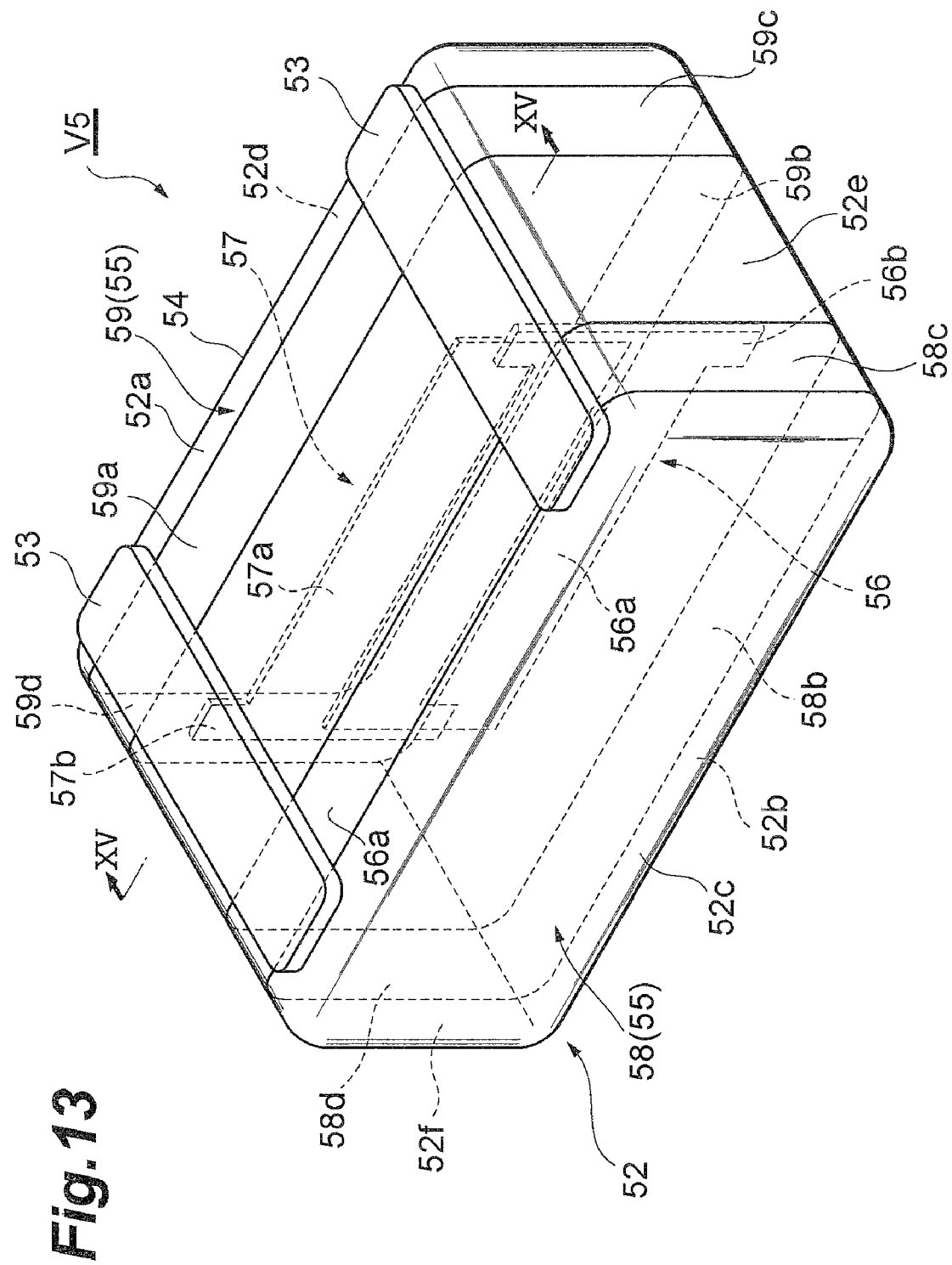
FIG. 13 is a perspective view of the varistor in accordance with a fifth embodiment of the present invention.
Figure 14:
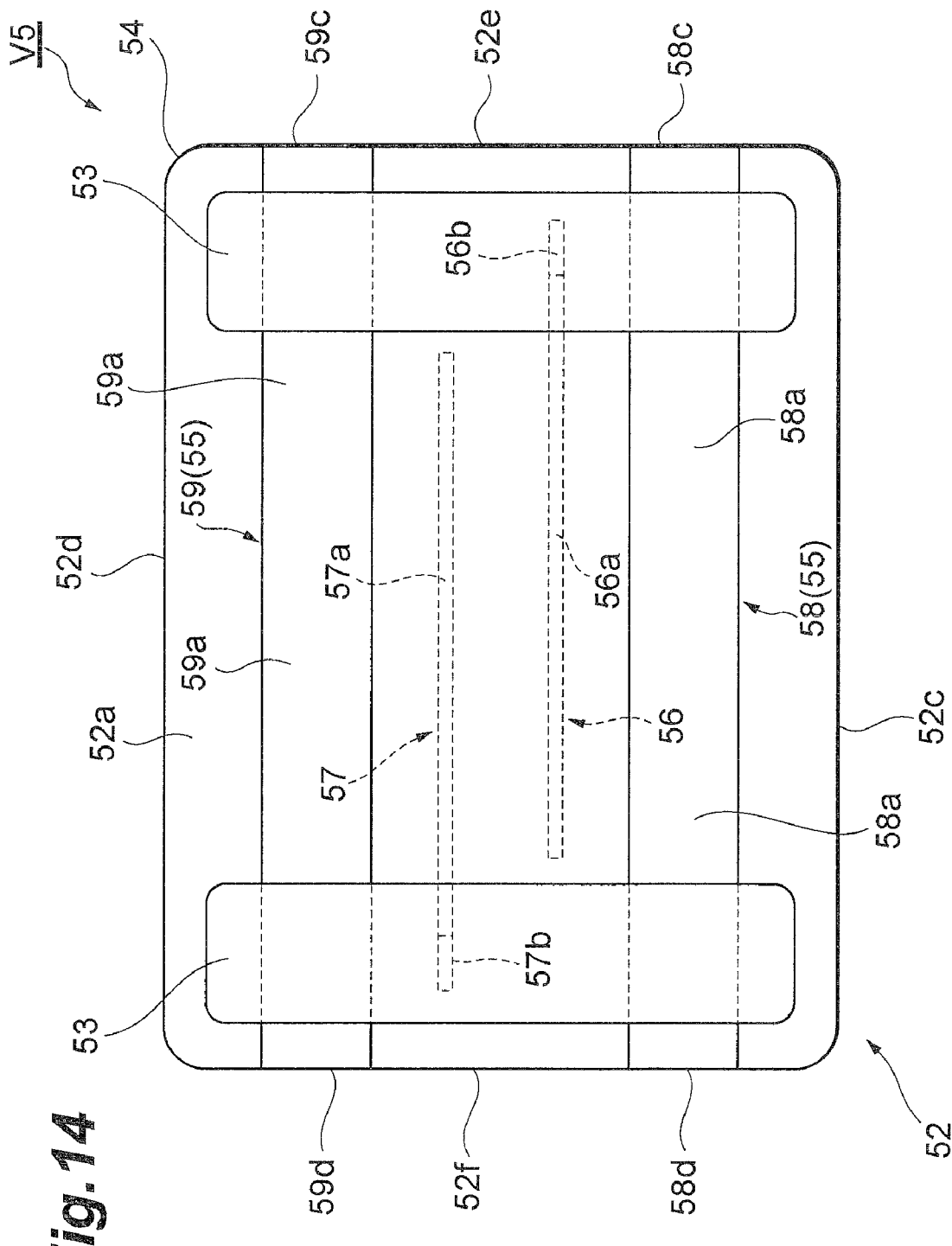
FIG. 14 is a plan view of the varistor illustrated in FIG. 13.
Figure 15:
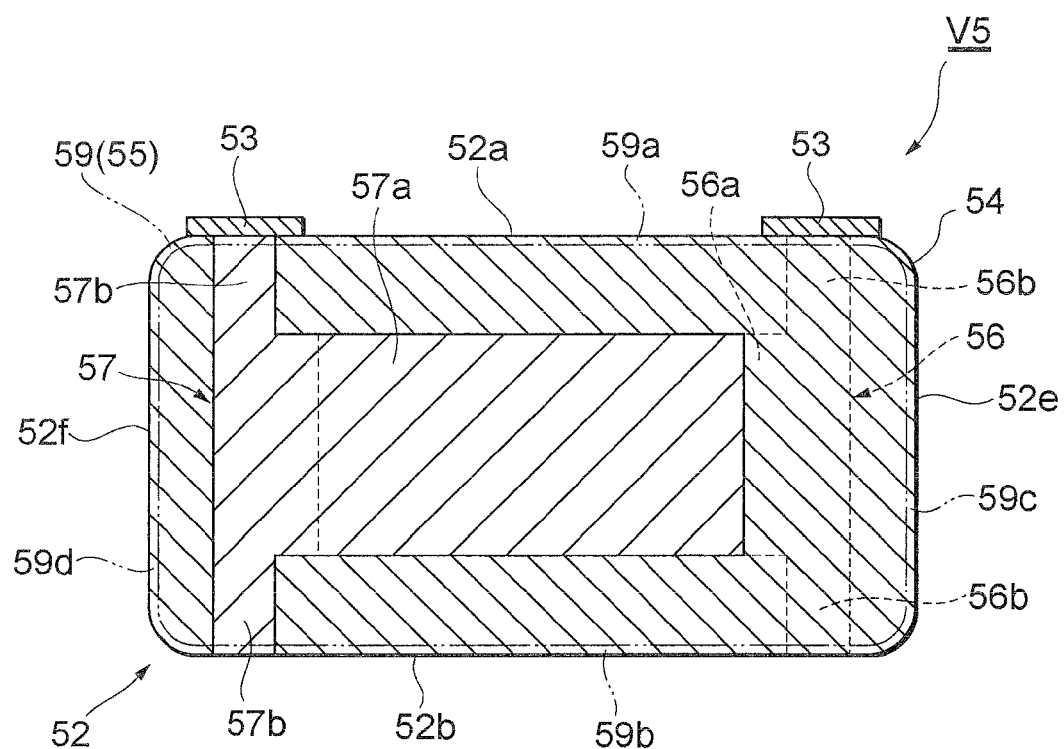
FIG. 15 is a sectional view taken along the line XV-XV of FIG. 13.

FIG. 13 is a perspective view illustrating the varistor in accordance with the fifth embodiment of the present invention. FIG. 14 is a plan view of the varistor illustrated in FIG. 13, while FIG. 15 is a sectional view taken along the line XV-XV of FIG. 13. As illustrated in FIGS. 13 to 15, this varistor V5 has a varistor matrix 52 and a pair of outer electrodes 53, 53.

The varistor matrix 52 is provided with a varistor part 54 substantially formed like a rectangular parallelepiped and has main faces (first and second main faces) 52a, 52b opposing each other and four side faces 52c to 52f orthogonal to the main faces 52a, 52b. The varistor part 54 is a part which exhibits a voltage nonlinear characteristic between the outer electrodes 53, 53 and is formed by a semiconductor ceramic containing ZnO as a main ingredient and Pr or Bi as an accessory ingredient, for example.

A composite part 55, a first inner electrode 56, and a second inner electrode 57 are provided within the varistor device 52. The first and second inner electrodes 56, 57 are formed by a metal such as an Ag—Pd alloy, for example, and have a thermal conductivity which is several to several ten times that of ZnO which is a main ingredient of the varistor part 54. The first and second inner electrodes 56, 57 have planar parts 56a, 57a and connecting strips 56b, 57b projecting from respective one end parts of the planar parts 56a, 57a to both main faces 52a, 52b of the varistor matrix 52.

The first and second inner electrodes 56, 57 are arranged, while holding a part of the varistor part 54 therebetween, such that the connecting strips 56b, 57b are positioned on respective sides opposite from each other, whereby the planar parts 56a, 57a mostly oppose each other. One leading end part of each of the connecting strips 56b, 57b is drawn so as to be exposed at the main face 52a of the varistor matrix 52, while the other leading end part is drawn so as to be exposed at the main face 52b.

On the other hand, the composite part 55 is formed by a composite material composed of ZnO and Ag, for example, and is constituted by a first portion 58 and a second portion 59. The first and second portions 58, 59, each having a planar form thicker than each of the first and second inner electrodes 56, 57, are arranged substantially parallel to each other so as to hold the first and second inner electrodes 56 and 57 therebetween.

The first portion 58 has widthwise end faces 58a, 58b exposed at the main faces 52a, 52b of the varistor 52, respectively, and longitudinal end faces 58c, 58d exposed at the side faces 52e, 52f of the varistor matrix 52, respectively. Similarly, the second portion 59 has widthwise end faces 59a, 59b exposed at the main faces 52a, 52b of the varistor 52, respectively, and longitudinal end faces 59c, 59d exposed at the side faces 52e, 52f of the varistor matrix 52, respectively.

Such a varistor V5 can also yield operations and effects similar to those of the varistor V1 in accordance with the first embodiment. Since a varistor characteristic can be exhibited between the first and second inner electrodes 56, 57, a desirable varistor characteristic can be obtained more reliably.

Figure 16:
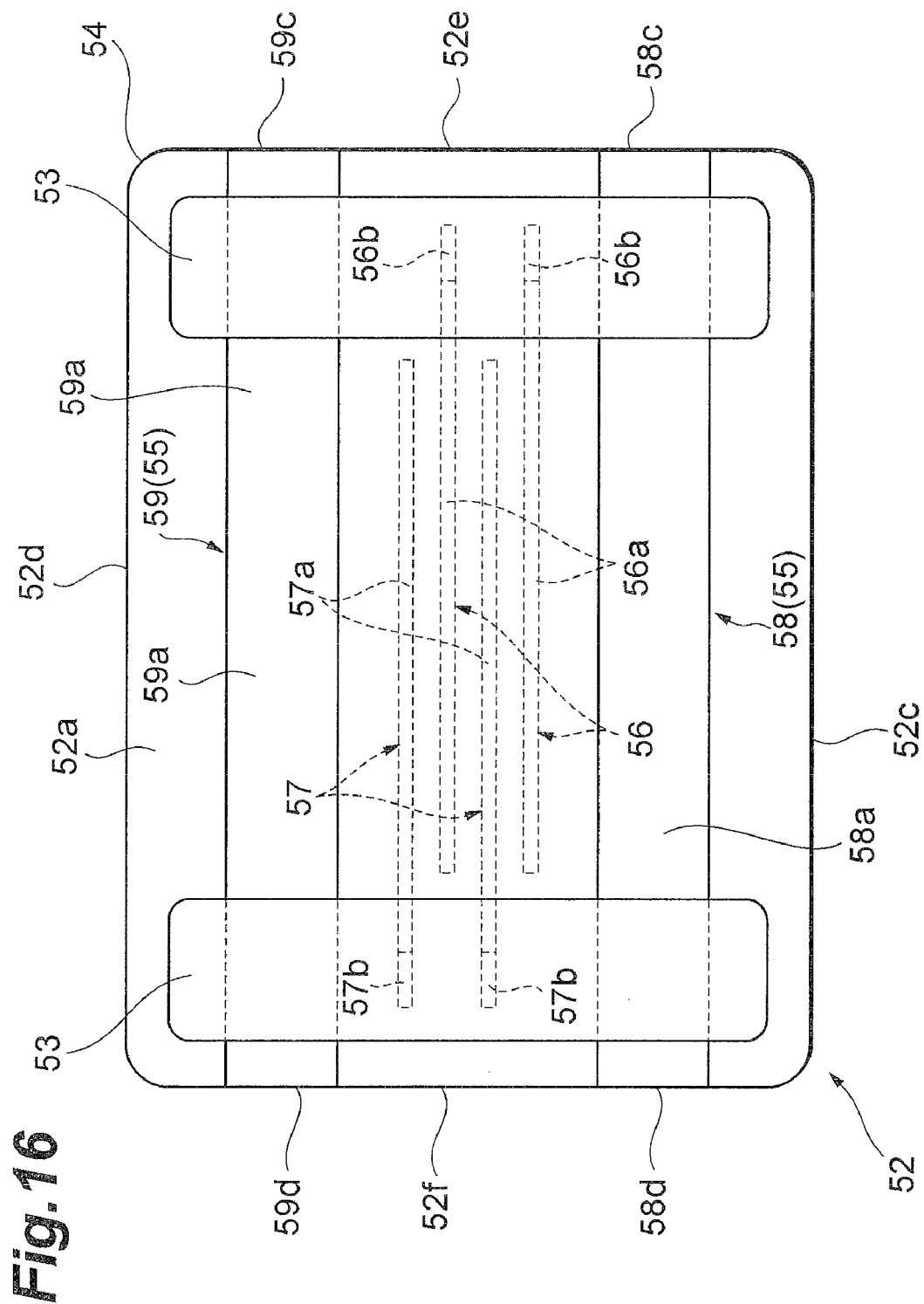
FIG. 16 is a plan view illustrating the varistor in accordance with a modified example of the fifth embodiment.

As illustrated in FIG. 16, the number of first and second inner electrodes 56, 57 arranged may be changed as appropriate according to varistor characteristics required. In the example illustrated in the same drawing, the first and second inner electrodes 56, 57 are increased to two pairs.

Figure 17:
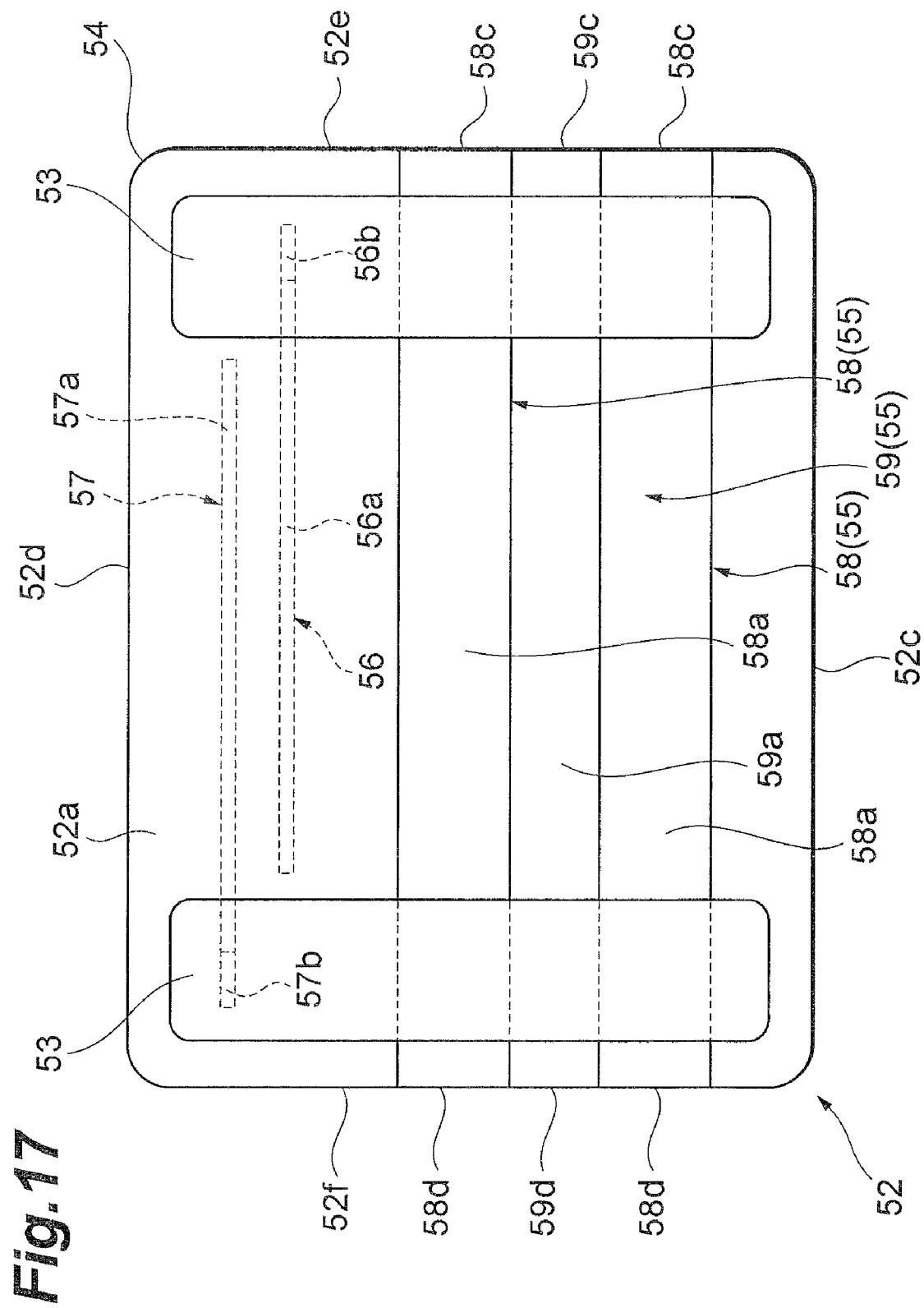
FIG. 17 is a plan view illustrating the varistor in accordance with another modified example of the fifth embodiment.

As illustrated in FIG. 17, it is not necessary for the first and second inner electrodes 56, 57 to be held with the composite part 55. In the example illustrated in the same drawing, the first portion 58, second portion 59, and first portion 58 of the composite part 55 are continuously arranged with no gaps in order from the side face 52c side of the varistor matrix 52, while the first and second inner electrodes 56, 57 are arranged closer to the side face 52d of the varistor matrix 52 with a predetermined space from the composite part 55.

The present invention is not limited to the above-mentioned embodiments. Though the above-mentioned embodiments employ ZnO as an example of a semiconductor ceramic which is a main ingredient of the varistor matrix, not only ZnO but $SrTiO_3$, $BaTiO_3$, SiC, and the like may also be used as such a semiconductor ceramic.

Nitride-based semiconductor LEDs such as those based on InGaNAs other than those based on GaN and semiconductor LEDs and LDs not based on nitrides may also be connected to the varistors V1 to V5. Not only the LEDs but various electronic devices generating heat during their operations such as field effect transistors (FETs) and bipolar transistors may also be connected.

What is claimed is:

1. A varistor comprising:
    a ceramic matrix having first and second main faces opposing each other and
    a pair of outer electrodes disposed on the first main face;
    wherein the ceramic matrix comprises:
    a varistor part, constituted by a semiconductor ceramic mainly composed of a metal oxide, exhibiting a varistor characteristic between the outer electrodes and
    a composite part, constituted by a composite material composed of a metal and a metal oxide, extending from the first main face to the second main face.

2. A varistor according to claim 1, wherein the composite part has first and second portions arranged such as to oppose each other at least partly and
    wherein the varistor part is positioned between the first and second portions.

3. A varistor according to claim 2, wherein the varistor part is in contact with the first and second portions.

4. A varistor according to claim 2, wherein a surface of the composite part excluding opposing surfaces of the first and second portions forms an outer surface of the ceramic matrix.

5. A varistor according to claim 4, wherein, in the outer surface of the ceramic matrix, each side face orthogonal to the first and second main faces is covered with an electrically insulating material.

6. A varistor according to claim 2, wherein the varistor part has an inner electrode arranged such as to oppose the composite part at least partly.

7. A varistor according to claim 6, wherein the inner electrode has first and second inner electrodes arranged such as to oppose each other at least partly.

8. A varistor according to claim 7, wherein the first inner electrode is arranged where the varistor part and the first portion are in contact with each other and
    wherein the second inner electrode is arranged where the varistor part and the second portion are in contact with each other.

9. A varistor according to claim 1, further comprising a pair of outer electrodes on the second main face.

10. A varistor according to claim 1, wherein the metal oxide constituting the varistor part and the metal oxide constituting the composite part are made of the same material.

11. A varistor according to claim 1, wherein the metal oxide and metal are ZnO and Ag, respectively.

* * * * *